United States Patent
Ljungblad et al.

(10) Patent No.: US 12,062,518 B2
(45) Date of Patent: Aug. 13, 2024

(54) CATHODE ASSEMBLY FOR ELECTRON GUN

(71) Applicant: Freemelt AB, Mölndal (SE)

(72) Inventors: Ulric Ljungblad, Mölndal (SE); Robin Stephansen, Mölndal (SE)

(73) Assignee: Freemelt AB, Mölndal (SE)

(*) Notice: Subject to any disclaimer, the term of this patent is extended or adjusted under 35 U.S.C. 154(b) by 763 days.

(21) Appl. No.: 17/040,687

(22) PCT Filed: Mar. 22, 2019

(86) PCT No.: PCT/EP2019/057314
§ 371 (c)(1),
(2) Date: Sep. 23, 2020

(87) PCT Pub. No.: WO2019/180242
PCT Pub. Date: Sep. 26, 2019

(65) Prior Publication Data
US 2021/0050174 A1 Feb. 18, 2021

Related U.S. Application Data

(60) Provisional application No. 62/646,935, filed on Mar. 23, 2018.

(51) Int. Cl.
*H01J 37/065* (2006.01)
*H01J 29/04* (2006.01)
*H01J 37/32* (2006.01)

(52) U.S. Cl.
CPC ............ *H01J 37/065* (2013.01); *H01J 29/04* (2013.01); *H01J 37/32724* (2013.01)

(58) Field of Classification Search
CPC .......... H01J 37/00; H01J 37/02; H01J 37/065; H01J 37/32724; H01J 37/075; H01J 37/26;
(Continued)

(56) References Cited

U.S. PATENT DOCUMENTS 3,928,783 A * 12/1975 Hosoki ............... H01J 1/20
313/305
4,082,937 A * 4/1978 Istomin ............... H01J 37/065
313/337

(Continued)

FOREIGN PATENT DOCUMENTS

EP 1 587 129 A1 10/2005
JP 2009-158365 A 7/2009

OTHER PUBLICATIONS

Caulfield et al., Cesium-Antimony Films in Equilibrium with Cesium Vapor, Jan. 1966, Journal of Applied Physics, vol. 37, No. 13, pp. 4927-4935. (Year: 1966).*

*Primary Examiner* — Jason L McCormack
(74) *Attorney, Agent, or Firm* — Faegre Drinker Biddle & Reath LLP

(57) ABSTRACT

A cathode assembly for emitting charged particles, used in for example an electron gun as source for generating an electron beam is provided. The cathode assembly has a cathode including an emitting member and a carrier. The emitting member is mounted in the carrier, and the carrier is electrically connected to a holder. The cathode is heated by irradiation from an external source, whereby the emitting member emits charged particles from an emitting surface at an emitting temperature. The connection between the carrier and the holder provides a thermal barrier for reducing the amount of thermal energy transferred from the cathode to the holder.

15 Claims, 2 Drawing Sheets

(58) Field of Classification Search
CPC .. H01J 37/28; H01J 37/073; H01J 1/20; H01J 29/04
USPC .................. 250/492.1, 492.3, 306, 307, 311
See application file for complete search history.

(56) References Cited

U.S. PATENT DOCUMENTS

| | | | | |
|---|---|---|---|---|
| 4,460,831 | A * | 7/1984 | Oettinger | B82Y 10/00 313/542 |
| 5,218,263 | A | 6/1993 | Falce et al. | |
| 5,686,785 | A * | 11/1997 | Movchan | H01J 37/067 219/121.26 |
| 2006/0284562 | A1* | 12/2006 | Hruby | H01J 27/16 315/111.61 |
| 2010/0244656 | A1* | 9/2010 | Ito | H01Q 23/00 343/843 |
| 2014/0055025 | A1* | 2/2014 | Yasuda | H01J 37/26 313/364 |
| 2016/0181453 | A1* | 6/2016 | Anantram | H01L 31/035227 257/443 |
| 2018/0239336 | A1* | 8/2018 | Barr | H01J 37/305 |

\* cited by examiner

CATHODE ASSEMBLY FOR ELECTRON GUN

CROSS-REFERENCE TO PRIOR APPLICATIONS

This application is a § 371 National Stage Application of PCT International Application No. PCT/EP2019/057314 filed Mar. 22, 2019, which claims priority to U.S. Provisional Application No. 62/646,935 filed on Mar. 23, 2018, both of which are incorporated herein in their entirety.

TECHNICAL FIELD

Electron guns are used in various machines and applications. This invention relates to a charged particle emitter, such as a cathode assembly. An emitting cathode, in the cathode assembly, is used as a source for generating electrons in an electron gun for creating an electron beam.

DESCRIPTION OF RELATED ART

Electron beams generated by electron guns are used in for example 3D-printers, electron beam welding machines, electron beam lithography systems and electron microscopes. Known problems in prior art technology are expensive cathodes and electron beams having aberrations resulting in poor beam quality with low beam resolution. Further, there is risk for contamination of cathodes and emitters from the process taking place in such systems.

EP 1587129 B1 describes a cathode having an emitter of the material lanthanum hexaboride (LaB6) and an emitter carrier of tantalum. The importance of good beam quality is described, where it is important to launch the beam with a well defined divergence, high brightness and low aberration. It is described how the attachment of the emitting material has been done by brazing it into place or coating the periphery of the emitter with tungsten. It is proposed to reduce heat losses by minimising the area of contact between the emitter and the carrier.

Problems with the Prior Art

It may be complicated to achieve a reliable thermal barrier between the emitting member and the carrier, since the carrier is often manufactured from a different material than the emitting member.

There is therefore a need for an improved cathode assembly.

SUMMARY OF THE INVENTION

This invention relates to a cathode assembly for emitting charged particles having a cathode comprising an emitting member and a carrier, said emitting member being mounted in the carrier, said carrier being electrically connected to a holder, said cathode being heated by irradiation from an external source, whereby the emitting member emits charged particles from an emitting surface at an emitting temperature, wherein the connection between said carrier and said holder provides a thermal barrier for reducing the amount of thermal energy transferred from the cathode to the holder.

In embodiments, the charged particles are electrons.

In embodiments, the emitting member is made of a material having a lower work function than the material in the carrier.

In embodiments, the contact area of the connection between the carrier and the holder is smaller than the contact area of the connection between the emitting member and the carrier.

In embodiments, the cathode is heated by irradiation of the emitting member and/or the carrier from an external source.

In embodiments, the carrier is designed as a tube, and the cathode is mounted in one end of the tube.

In embodiments, the holder is designed as a tube, and the cathode is mounted in one end of the tube.

In embodiments, the irradiation takes place at the opposite side to the emitting surface.

In embodiments, the cathode has an irradiation surface separate from the emitting surface, and the cathode is heated by irradiating the irradiation surface by irradiation from an external source.

In embodiments, the external source is an electron gun.

In embodiments, the external source is a laser.

In embodiments, the external source is an IR heater.

In embodiments, the emitting surface of the emitting member is flush with the adjacent surface of the carrier.

In embodiments, the thermal barrier between the cathode and the holder is designed as a ridge on the carrier and a groove in the holder.

In embodiments, the thermal barrier between the cathode and the holder is designed as a groove in the carrier and a ridge on the holder.

In embodiments, the cathode assembly is used in a diode electron gun.

In embodiments, the cathode assembly is used in an electron gun.

In embodiments, the cathode assembly is used in a 3D printer.

In embodiments, the carrier and/or the holder is provided with a weakening mechanical structure.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF DRAWINGS

In the description of the invention references are made to the following figures, in which.

Embodiments of the present disclosure and their advantages are best understood by referring to the detailed description that follows. It should be appreciated that like reference numerals are used to identify like elements illustrated in one or more of the figures.

DESCRIPTION AND DISCLOSURE OF THE INVENTION

Figure 1:
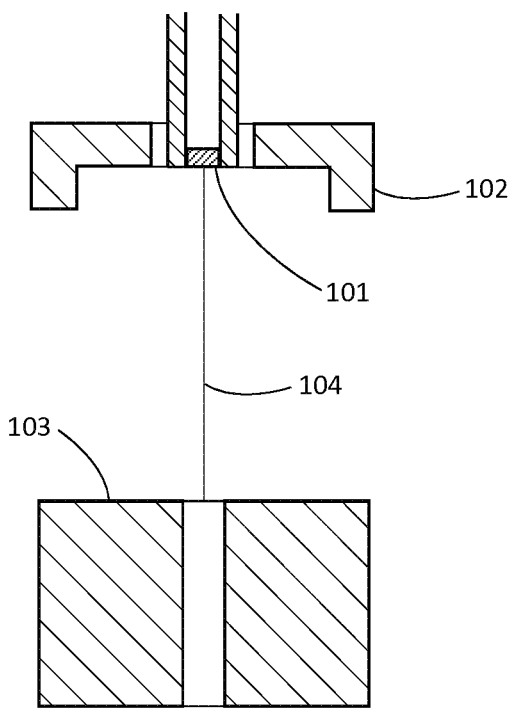
FIG. 1 shows, in a schematic section view, a diode electron gun with an electron beam, a cathode and an anode.

The purpose of this invention is to provide cheaper manufacturing of cathodes and to provide less complicated mechanics for temperature break or thermal barriers in cathodes. These kinds of cathodes can be used in additive manufacturing machines such as e.g. 3D-printers, electron beam welding machines, or electron microscopes. The emitting material, for example $LaB_6$, $CeB_6$, or tungsten, needs to be kept at a high temperature to emit electrons. Hence it is desired to prevent heat loss from the cathode, i.e. emitting member and carrier. Less heat loss from the cathode will result in a reduced energy input demand into the cathode, and the required power of the external heating source can thus be reduced. Also, if less energy can be inputted into the cathode, less energy needs to be cooled away from the cathode.

It is advantageous to keep the cooling requirements at a low level since this reduces complexity and space required from equipment for cooling the cathode. Further it is good to keep the surrounding components, i.e. holder, attachment and housing, at lower temperatures to avoid thermal distortion. It is also possible to choose cheaper and less advanced materials for the components in the cathode assembly due to lower operation temperature. Another main advantage with reduced heat transport from the cathode is that the external heat source can be designed for delivery of less power to the cathode or the emitting member.

It is of importance to provide a thermal barrier in close vicinity to the emitting member to reduce the heated material volume and area. The larger the heated volume is, the more energy needs to be supplied to reach the required operation temperature of the emitting member. The larger the area of the cathode is, the more heat will be radiated away from the cathode leading to an increased demand of heating in order to sustain the required operating temperature of the emitting member.

The invention is based on the understanding that it may be easier to achieve a reliable thermal barrier between the carrier and the holder than directly between the emitting member and the carrier, since the carrier is often manufactured from a different material than the emitting member. Examples of materials in the carrier and the holder are tantalum, molybdenum, and steel.

By separating the thermal barrier from the connection and attachment between the emitting member and the carrier, it will be easier to achieve both a good thermal barrier and a good attachment of the emitting member in the carrier. The efficiency of the thermal barrier between the cathode and the holder depends on the size of the contact area, and to some degree on the geometry of the thermal barrier where the contact area determines the heat loss caused by thermal conduction. The smaller the contact area between the cathode and the holder is, the less heat is conducted away from the cathode.

The thermal barrier between the cathode and the holder may be performed as a ridge at the carrier and a groove in the holder. Alternatively, the thermal barrier between the cathode and the holder may be a groove in the carrier and a ridge at the holder. Other arrangements are also possible.

The input energy to the cathode may e.g. be provided by irradiating energy from a laser, an electron beam or an IR heater onto the cathode. There is a balance between input and output energy from the cathode, where the output typically consists of heat radiation and heat conduction. Heat convection is not part of the heat transfer in this case, due to the fact that the cathode assembly in an electron gun is surrounded by vacuum. The output heat radiation can be kept low by choosing a material with low emissivity and a small radiating area of the cathode. The output heat conduction can be kept low by choosing a material with low thermal conductivity and by designing the cathode with a small contact area with the surroundings, e.g. with the holder. This small contact area or area reduction can be performed as a neck, a notch and groove, a knife edge, or several point contacts. Typically it would be advantageous if the contact area between carrier and holder is smaller than the contact area between emitting material and carrier, such as e.g. less than half the size, less than one fifth of the size, or less that one tenth of the size of the contact area between emitting material and carrier.

There are several possibilities for heating of the cathode. One possibility is back heating of the emitting member, i.e. heating an irradiating surface of the emitting member positioned opposite to the emitting surface (this irradiating surface can also be called the back side of the cathode). Another possibility is to heat both the emitting member and the carrier. Another possibility is to heat just the carrier, which can be advantageous if the emitting material is sensitive to the irradiating energy from the external heat source, or if the absorption efficiency of the irradiation from the external source is higher for the carrier than for the emitting member. This can also be called indirect heating. The choice of which member to heat by means of irradiation can advantageously be selected from the aspect of least reflectance of incident heating radiation. Another option is to heat, by irradiation, the front surface of the cathode, i.e. the emitting surface itself. Yet another option is to heat at least one side surface of the cathode, i.e. at least one surface of the cathode that is substantially perpendicular to the emitting surface or has another angle with respect to the emitting surface.

It is advantageous to provide the emitting surface flush with, in same plane as, or level with the surrounding surface of the carrier, as this will provide a better situation with respect to emission angles of charged particles from the emitting member. This can be achieved by machining, e.g. grinding, of the cathode after the emitting material has been assembled in the carrier. Alternatively the flush surfaces can be achieved by an accurate pressing of the emitting member into the carrier. Having the emitting surface flush with the surrounding surface of the carrier will prevent emission of charged particles from the side of the emitting member. It is desired to avoid such side emission of electrons to achieve an even and well defined beam of charged particles. Typically the charged particles are electrons.

Designing the carrier or holder as a tube, where the emitting member is mounted in one end of the tube, provides advantages due to the fact that there will be protecting walls around the irradiated surface on the back side of the emitting member. This provides protection to the emitting material but also avoids contamination of surrounding components by evaporation from the hot emitting member and carrier.

The work function of a material provides information about the amount of electron emission as a function of the temperature. Since the emitter material is different from the carrier and holder materials (e.g. tantalum, molybdenum, steel), there is also a difference in work function.

It is desired to choose materials for the emitter member, the carrier and the holder that are electrically conductive in order to maintain a uniform and well defined potential in the region of the cathode. It is further also desired to design the cathode assembly for electric contact throughout the components, emitting member, carrier and holder. Further, the material in the emitting member is preferably chosen with a lower work function than the carrier, since the purpose of the emitting member is to emit electrons at a lower temperature than the carrier.

In FIG. 1 is shown a schematic section of a diode electron gun having a cathode 101, an electrode 102 and an anode 103. The cathode 101 is provided with an emitting member that is heated for emission of electrons. The emitted electrons are accelerated by applying a voltage between the cathode 101 and the anode 103 for generation of an electron beam 104. The electron gun is provided with an electrode 102 for forming of the electromagnetic field in the area close to the cathode 101. In a diode electron gun, the electrode 102 is held at the same electrical potential as the cathode 101, contrary to a triode electron gun, where the electrode is normally held at a separate grid potential which can be made to vary to control the intensity of the electron beam. In a diode electron gun, the intensity of the electron beam is controlled by controlling the temperature of the cathode 101. A diode electron gun has the advantage over a triode electron gun that a better beam quality of the electron beam 104 can be achieved at high beam currents. Furthermore, diode guns are much less affected by cathode contamination from residual gasses than triode guns, resulting in more stable operation under conditions where a vacuum process is contaminating the vacuum environment, for instance by evaporation in electron beam welding or 3D printing.

Figure 2:
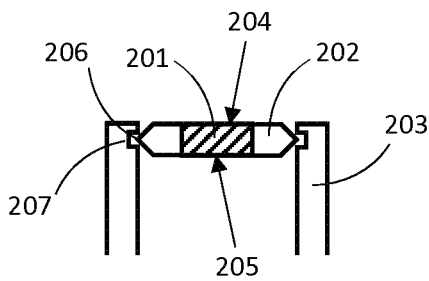
FIG. 2 shows, in a section view, in detail an embodiment of a cathode assembly according to the invention.

In the embodiment of this invention shown in FIG. 2, the cathode comprises an emitting member 201 having a cylindrical geometry and a circular emitting surface 204 for emitting electrons, the emitting member 201 being mounted in a cylindrical hole through a carrier 202. The emitting member 201 is preferably mounted by pressing the emitting member into the cylindrical hole. In the embodiment shown, the cathode has an irradiating surface 205 on the opposite side to the emitting surface 204. The carrier 202 may further have an outside machined circumferential ridge 206 which rests in a circumferential groove 207 in the holder 203, pushed in place by pressing the cathode into the hole of the holder 203. The holder 203 may have the geometry of a tube or pipe, with a circumferential groove 207 on the inside of the tube, where the groove 207 is positioned close to one end of the tube. The diameter of the ridge 206 at the carrier 202 is preferably larger than the inside diameter of the holder tube 203, but preferably fits in the groove 207 without touching the base of the groove 207. The dimension of the groove 207 on the inside of the holder 203 is preferably chosen to be slightly bigger than the cathode dimension, and the depth of the groove 207 is preferably small enough to achieve a tight fit between the cathode and the holder 203, with a small contact area where only the edges of the groove 207 contact the sloped surface of the ridge 206 at the carrier 202. During assembly of the cathode into the holder 203, the ridge 206 of the carrier 202 has to pass the inside diameter of the tube to reach the groove 207 in the holder 203. The material of the components will be slightly deformed before a press fit is achieved during this assembly step. The material of the holder 203 is preferably chosen to withstand this assembly of the cathode without causing permanent damage to the holder 203, such as cracking or permanent deformation. A further means of enabling this mounting while still avoiding permanent damage to the holder 203 or the carrier 202 is to design the holder 203 or the carrier 202 with slits or some other weakening mechanical structure.

Figure 3:
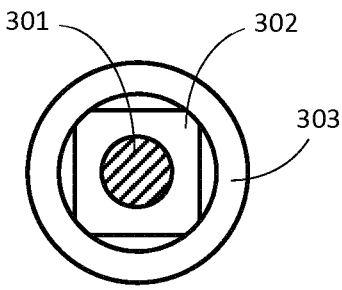
FIG. 3 shows, in a top view, in detail a further embodiment of a cathode assembly according to the invention.

In another embodiment, shown in FIG. 3, the carrier 302 is designed for an even smaller contact area between carrier 302 and holder 303. Four sides of the carrier 302 are machined away forming four contact areas between holder 303 and carrier 302. The carrier 302 can still be arranged with a ridge and the holder 303 with a groove at the contact points between the carrier 302 and the holder 303, to reduce the contact area between the carrier 302 and the holder 202. It is possible to machine away any number of sides of the carrier 302, but preferably at least three.

Figure 4:
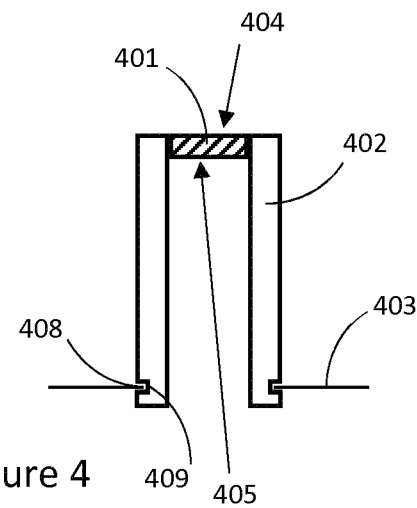
FIG. 4 shows, in a section view, in detail a further embodiment of a cathode assembly according to the invention.

In another embodiment of this invention, shown in FIG. 4, the carrier 402 may be designed as a tube or pipe, where the emitting member 401 is mounted in one end of the tube. The emitting member 401 has an emitting surface 404 and an irradiating surface 405. The emitting member 401 can e.g. be pressed into the interior hole of the carrier tube 402. Other possible ways for assembling the emitting member 401 and the carrier 402 are sintering, gluing, soldering and/or brazing. Further, the connection between carrier 402 and holder 403 in this case may be designed as a circumferential groove 409 on the outside of the carrier tube 402 and a ridge or knife edge 408 at the holder 403, where the ridge 408 engages the groove 409 to achieve an accurate assembly. In this embodiment, the holder 403 is designed as a thin plate, to achieve a small contact area with the carrier 402 for providing a low thermal conduction from the cathode to the surroundings.

Figure 5:
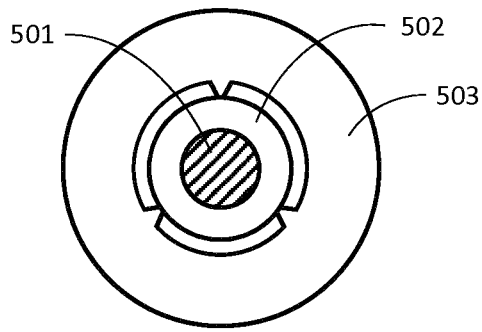
FIG. 5 shows, in a top view, in detail a further embodiment of a cathode assembly according to the invention.

In yet another embodiment of the invention, shown in FIG. 5, the carrier 502 is designed as a tube or pipe, where the emitting member 501 is mounted in one end of the tube. The holder 503 is provided with three tips or peaks for engagement with for example holes or a groove in the carrier 502. In this way there will be a small contact area between holder 503 and carrier 502 providing a low thermal conduction from the cathode to the surrounding. It is possible to use any number of tips or peaks, but preferably at least three.

In further embodiments of this invention, the contact between carrier and holder can be performed as a reduced area, one or several point contacts, or a neck. For facilitating the mounting of the holder and the carrier to each other, the holder or the carrier can be provided with one or more slits or slots to facilitate flexible or simpler mounting to each other. It is also possible to achieve this mounting by a resilient means or other weakening in either of the holder and the carrier, or in both components. It is also possible to arrange the carrier and the holder as one original part, where the thermal barrier has been accomplished by machining or by other subtractive mechanical forming such as for example etching of such an original part.

Other geometries for achievement of the thermal barrier are also possible. The ridge at the carrier, or at the holder, can for instance be designed with the ridge present only partly, intermittent, around the circumference of the thermal barrier, reducing the area of the thermal barrier further. Another possible geometry of the thermal barrier is a thin holder plate with a hole smaller than the carrier, having a groove where the holder is snapped into place. The hole diameter in the holder may e.g. be smaller than the carrier diameter at some angles and bigger at some angles, creating a pattern of point contact between holder and carrier.

Another possible geometry is a non-round holder combined with a round carrier, or vice versa. Yet another possible geometry is that both the holder and the carrier can be non-round and the mounting can be done in the way that one of them is turned 90 degrees, or some other angle, with respect to the other for fixing it into place.

These different embodiments should only be considered as examples, not limiting the possible different geometries of the carrier and the holder, to accomplish a good thermal barrier between the two. The object of this invention is to provide an improved cathode assembly. This object is achieved by the device defined in the independent claim. The dependent claims contain advantageous embodiments, variants and further developments of the invention.

What is claimed is:

1. A cathode assembly for emitting charged particles, comprising:
    a holder; and
    a cathode comprising:
        an electrically conductive carrier electrically connected to the holder, and
        an emitting member comprising an emitting surface that is configured to emit charged particles at an emitting temperature when heated by irradiation from an external source, wherein the emitting member is mounted in the carrier such that side surfaces of the emitting member are covered by the carrier to prevent any emission of charged particles from the side surfaces,
    wherein the connection between said carrier and said holder provides a thermal barrier for reducing the amount of thermal energy transferred from the cathode to the holder, and
    wherein the contact area of the connection between the carrier and the holder is smaller than the contact area of the connection between the emitting member and the carrier.

2. The cathode assembly according to claim 1, wherein the charged particles are electrons.

3. The cathode assembly according to claim 1, wherein the emitting member has a lower work function than the carrier.

4. The cathode assembly according to claim 1, wherein the cathode is heated by irradiation of the emitting member and/or the carrier from an external source.

5. The cathode assembly according to claim 1, wherein the carrier is designed as a tube, and the cathode is mounted in one end of the tube.

6. The cathode assembly according to claim 1, wherein the holder is designed as a tube, and the cathode is mounted in one end of the tube.

7. The cathode assembly according to claim 1, wherein the irradiation takes place at the opposite side to the emitting surface.

8. The cathode assembly according to claim 1, wherein the cathode has an irradiation surface separate from the emitting surface, and the cathode is heated by irradiating the irradiation surface by irradiation from an external source.

9. The cathode assembly according to claim 1, wherein the external source is an electron gun and/or a laser and/or an IR heater.

10. The cathode assembly according to claim 1, wherein the emitting surface of the emitting member is flush with the adjacent surface of the carrier.

11. The cathode assembly according to claim 1, wherein the thermal barrier between the cathode and the holder is designed as a ridge on the carrier and a groove in the holder.

12. The cathode assembly according to claim 1, wherein the thermal barrier between the cathode and the holder is designed as a groove in the carrier and a ridge on the holder.

13. The cathode assembly according to claim 1, wherein the cathode assembly is used in an electron gun.

14. The cathode assembly according to claim 1, wherein the cathode assembly is used in a 3D printer.

15. The cathode assembly according to claim 1, wherein the carrier and/or the holder is provided with a weakening mechanical structure.

* * * * *